(12) United States Patent
Kanakasabapathy et al.

(10) Patent No.: US 9,741,856 B2
(45) Date of Patent: Aug. 22, 2017

(54) STRESS RETENTION IN FINS OF FIN FIELD-EFFECT TRANSISTORS

(71) Applicant: International Business Machines Corporation, Armonk, NY (US)

(72) Inventors: Sivananda K. Kanakasabapathy, Niskayuna, NY (US); Gauri Karve, Cohoes, NY (US); Juntao Li, Cohoes, NY (US); Fee Li Lie, Albany, NY (US); Stuart A. Sieg, Albany, NY (US); John R. Sporre, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/956,711

(22) Filed: Dec. 2, 2015

(65) Prior Publication Data

US 2017/0162685 A1 Jun. 8, 2017

(51) Int. Cl.

| | |
|---|---|
| *H01L 29/78* | (2006.01) |
| *H01L 29/66* | (2006.01) |
| *H01L 21/8234* | (2006.01) |
| *H01L 29/06* | (2006.01) |
| *H01L 21/308* | (2006.01) |
| *H01L 29/423* | (2006.01) |

(52) U.S. Cl.
CPC ........ *H01L 29/785* (2013.01); *H01L 21/3086* (2013.01); *H01L 21/823431* (2013.01); *H01L 29/0649* (2013.01); *H01L 29/42356* (2013.01); *H01L 29/66795* (2013.01); *H01L 29/7845* (2013.01); *H01L 29/7846* (2013.01)

(58) Field of Classification Search
CPC ..... H01L 21/823431; H01L 21/823821; H01L 21/845; H01L 29/66795; H01L 29/42356; H01L 21/0337; H01L 21/3086
See application file for complete search history.

(56) References Cited

U.S. PATENT DOCUMENTS

| | | |
|---|---|---|
| 7,994,583 B2 | 8/2011 | Inaba |
| 8,154,089 B2 | 4/2012 | Ohguro |
| 8,368,148 B2 | 2/2013 | Inaba |

(Continued)

FOREIGN PATENT DOCUMENTS

| | | |
|---|---|---|
| JP | 2011233594 A | 11/2011 |
| TW | 201445635 A | 12/2014 |

*Primary Examiner* — Daniel Luke
(74) *Attorney, Agent, or Firm* — Erik K. Johnson

(57) ABSTRACT

Embodiments of the present invention provide a structure and method of minimizing stress relaxation during fin formation. Embodiments may involve forming a looped spacer on an upper surface of a substrate and adjacent to at least a sidewall of a mandrel. The mandrel may be removed, leaving the looped spacer on the substrate. An exposed portion of the substrate may be removed to form a looped fin below the looped spacer. The spacer may be removed, leaving a looped fin. A looped fin formation may reduce stress relaxation compared to conventional fin formation methods. Embodiments may include forming a gate over a looped portion of a looped fin. Securing a looped portion in position with a gate may decrease stress relaxation in the fin. Thus, a looped fin with a looped portion of the looped fin under a gate may have substantially reduced stress relaxation compared to a conventional fin.

15 Claims, 26 Drawing Sheets

(56) References Cited

U.S. PATENT DOCUMENTS

| | | |
|---|---|---|
| 9,000,483 B2 | 4/2015 | Hong et al. |
| 2006/0292776 A1 | 12/2006 | Jin et al. |
| 2008/0308880 A1* | 12/2008 | Inaba .............. H01L 21/823807 257/401 |
| 2010/0308409 A1 | 12/2010 | Johnson et al. |
| 2011/0068401 A1* | 3/2011 | Izumida .......... H01L 21/823431 257/347 |
| 2014/0001572 A1 | 1/2014 | Bohr et al. |
| 2014/0299934 A1* | 10/2014 | Kim .................... H01L 29/7848 257/347 |
| 2014/0339641 A1* | 11/2014 | Hong ................. H01L 27/0886 257/368 |
| 2015/0179770 A1 | 6/2015 | Hong et al. |

* cited by examiner

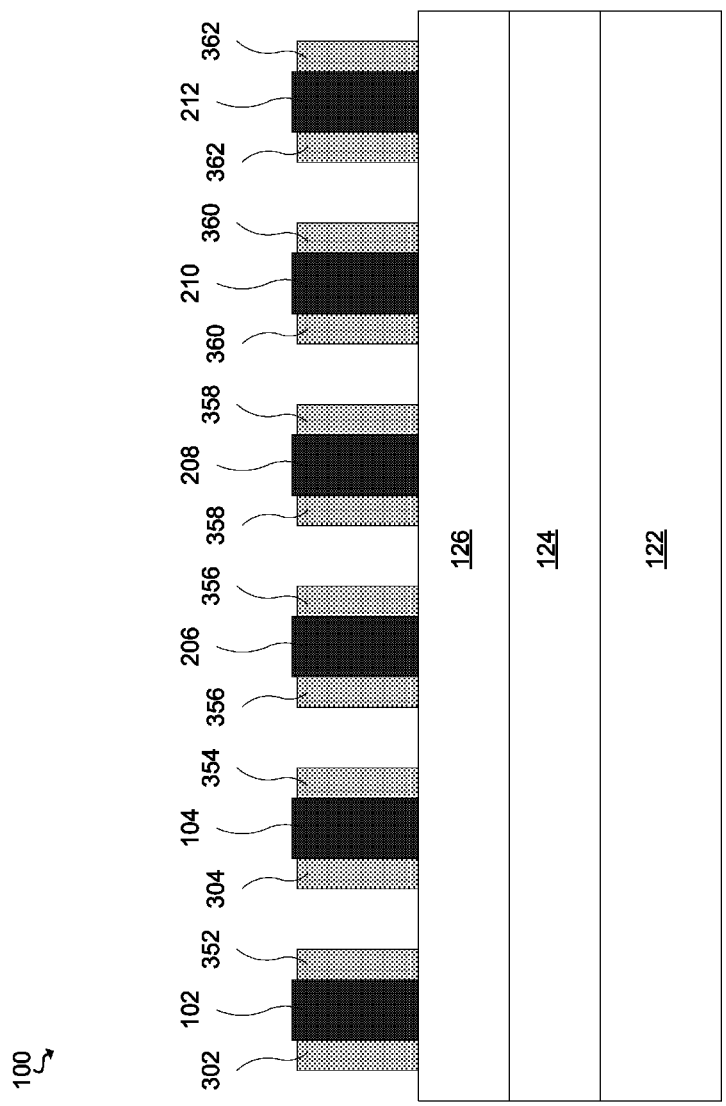

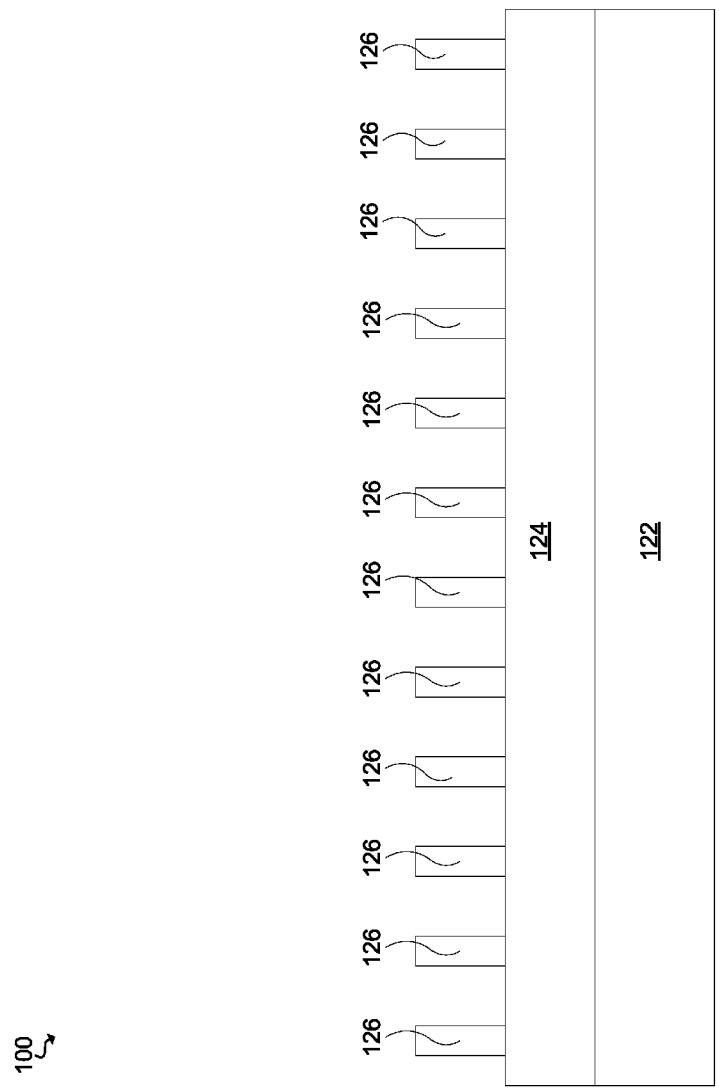

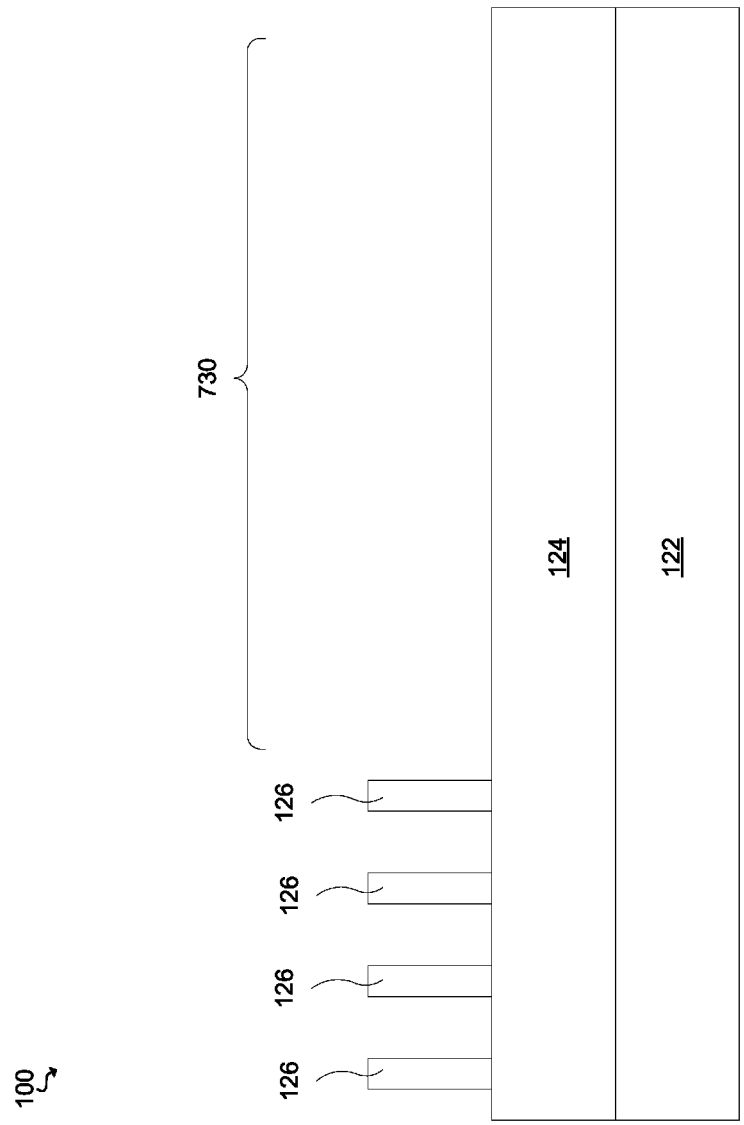

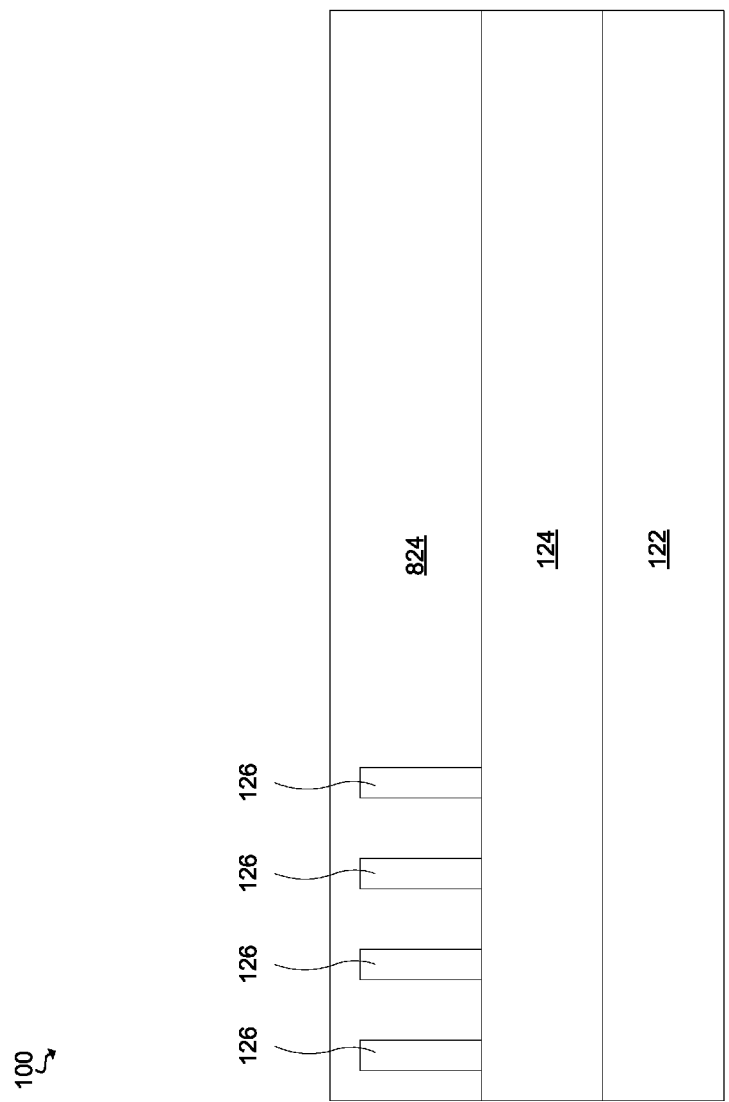

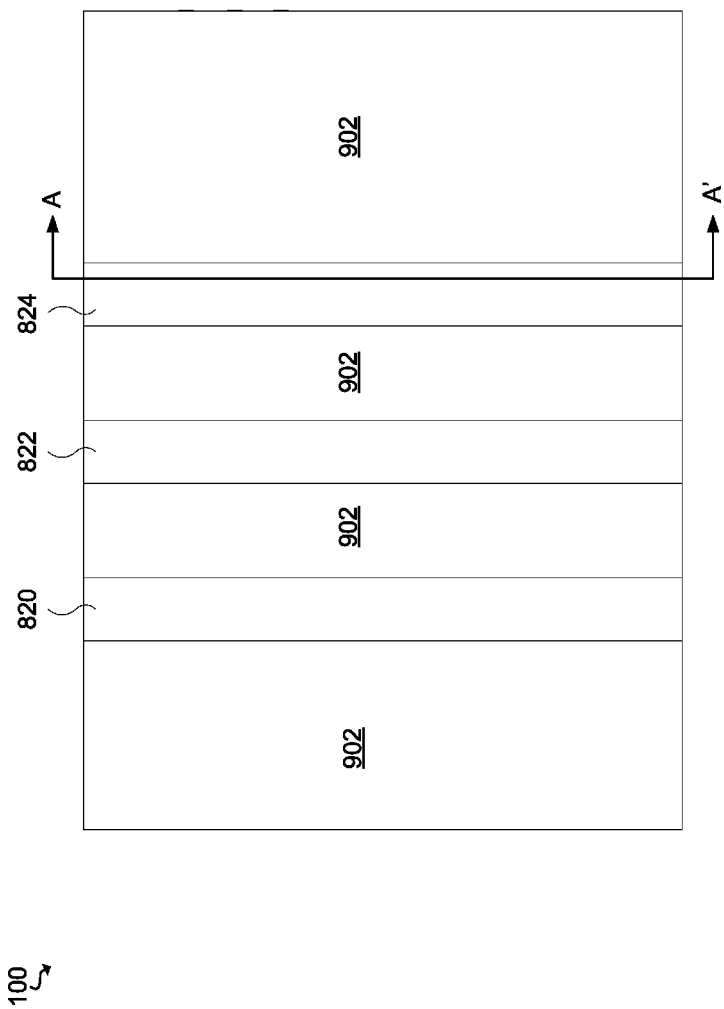

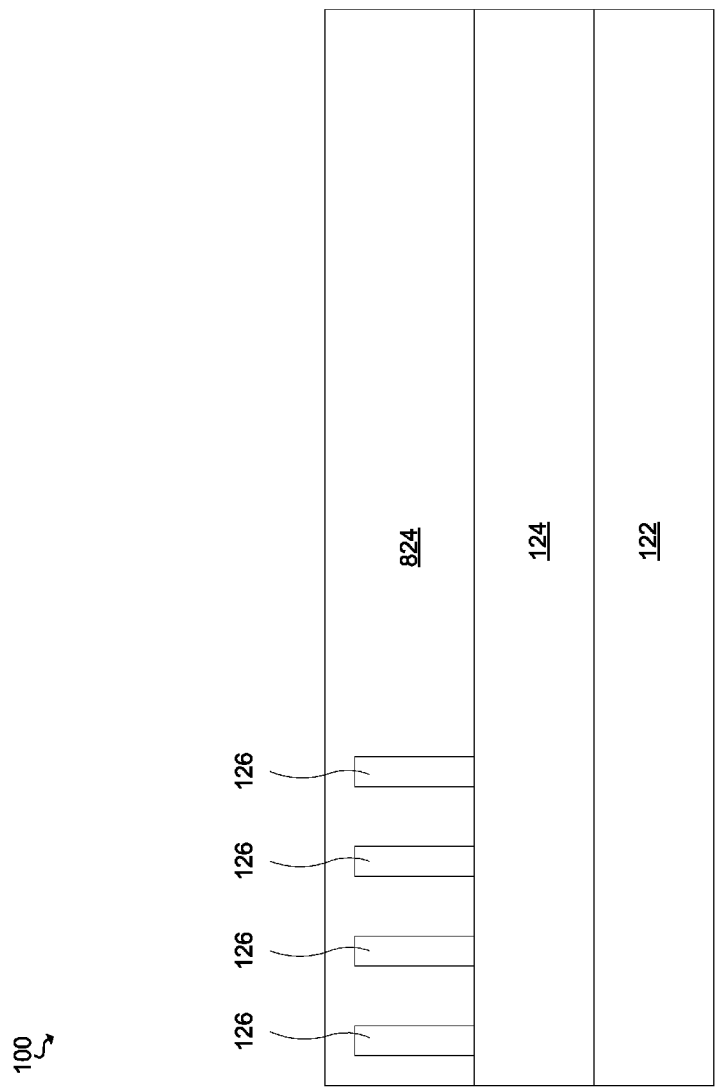

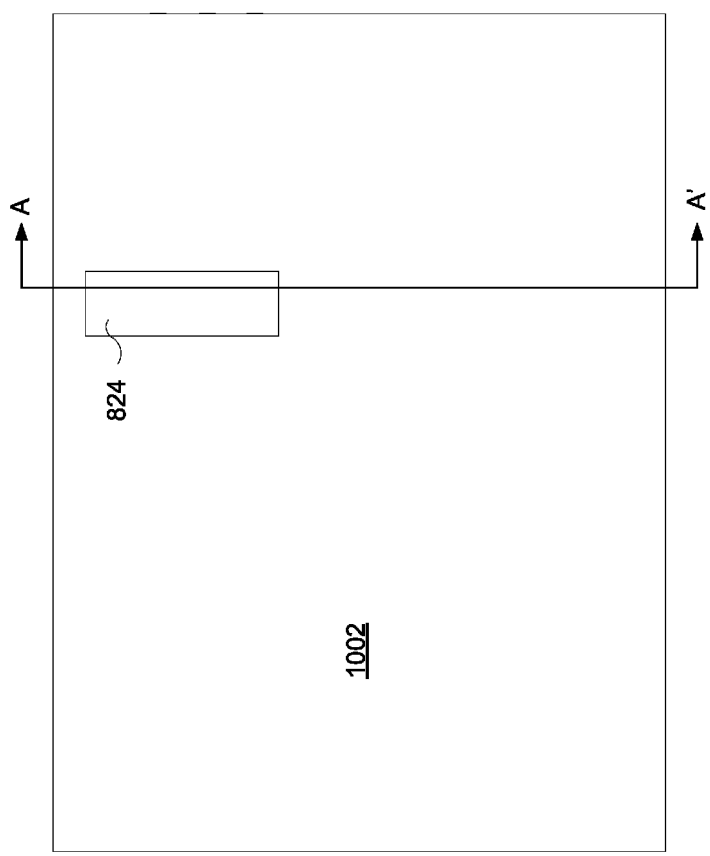

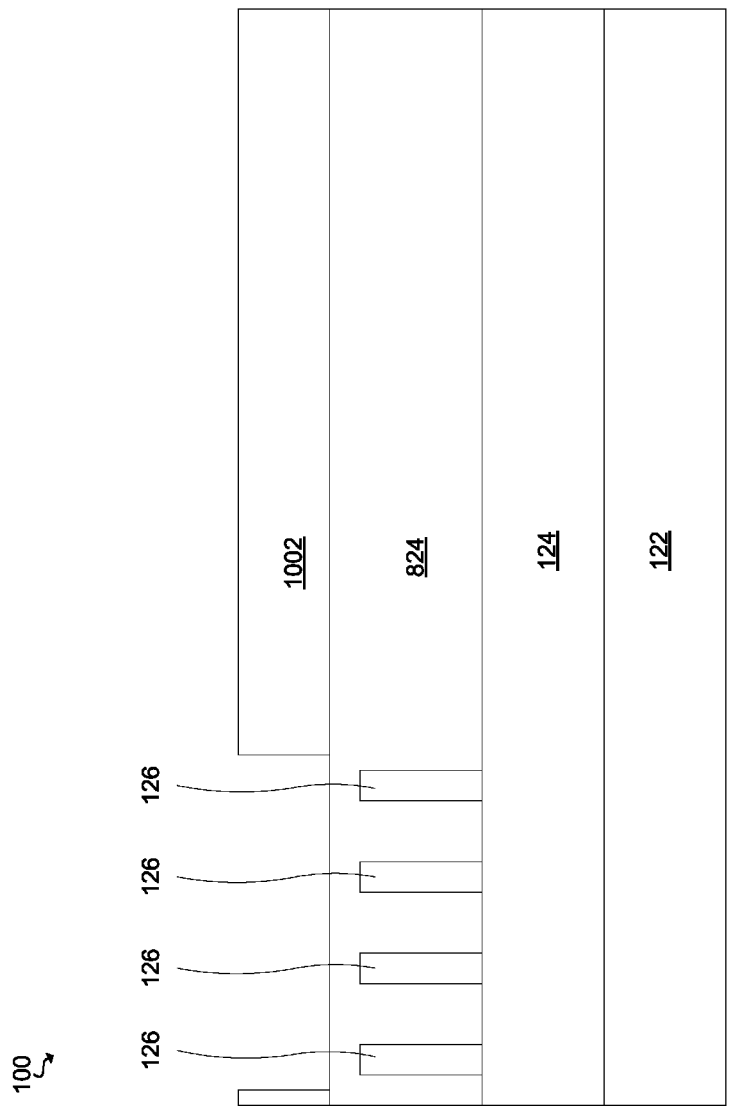

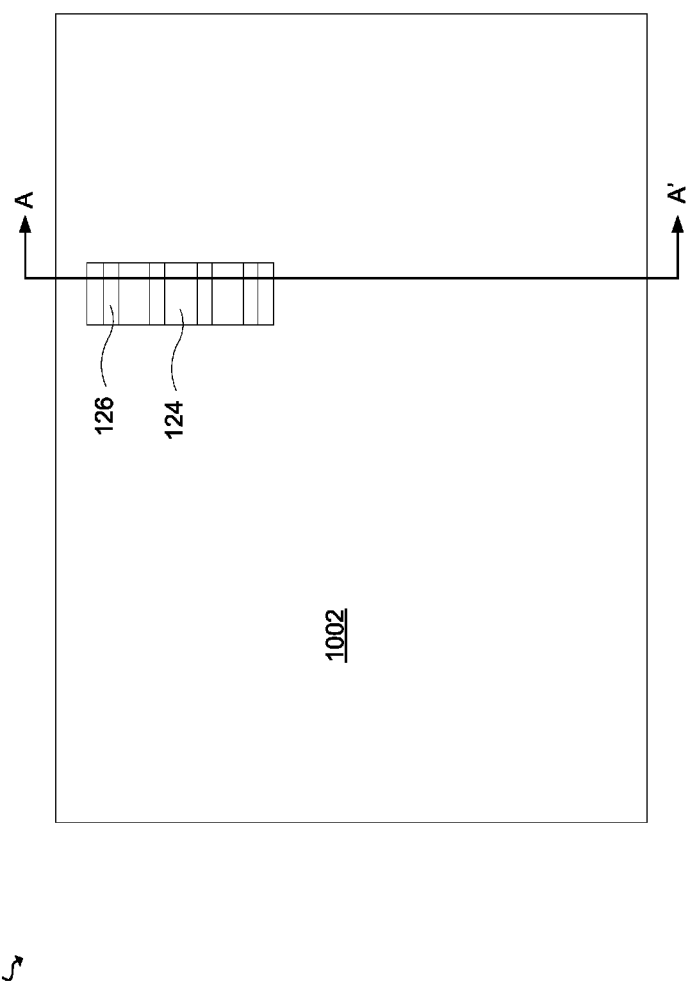

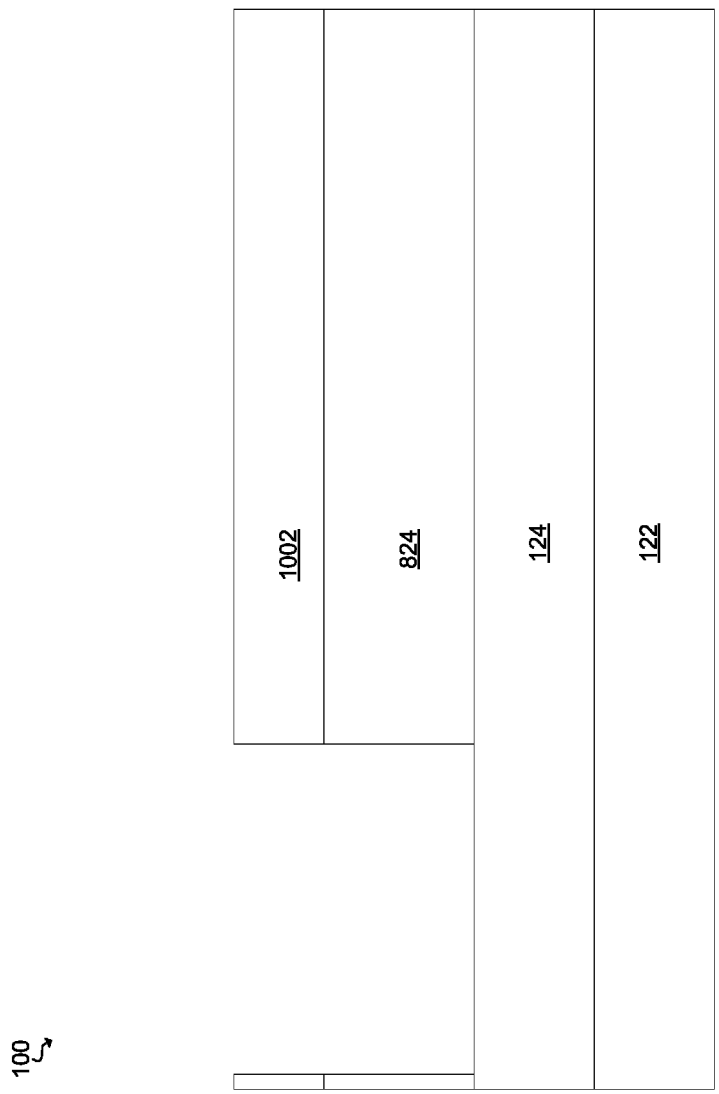

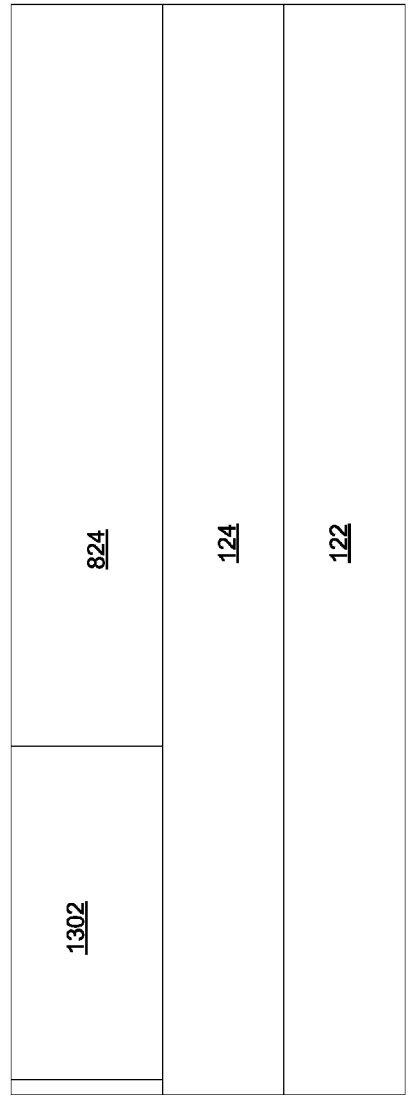

STRESS RETENTION IN FINS OF FIN FIELD-EFFECT TRANSISTORS

BACKGROUND

The present invention relates generally to microelectronics and more particularly, to a structure and method of retaining stress in fins of fin field-effect transistors (finFETs). Intrinsic stress in a fin of a finFET may boost mobility of charge carriers, and thus, increase performance of the finFET. Cutting an intrinsically stressed semiconductor layer to form fins may reduce the intrinsic stress in a fin compared to the semiconductor layer. A reduction in stress from cutting a fin may result in lost finFET performance.

SUMMARY

According to an embodiment, a method is disclosed. The method may include forming a looped spacer around a first portion of a mandrel on an upper surface of a substrate. The looped spacer may be adjacent to a first sidewall of the first portion of the mandrel, an inner edge of the first portion of the mandrel, and a second sidewall of the first portion of the mandrel. The method may include removing the first portion of the mandrel. The method may include removing an exposed portion of the substrate. Removing the exposed portion of the substrate may form the looped fin below the looped spacer. The method may include removing the looped spacer. The method may include forming a gate on the upper surface of the substrate and on a looped portion of the looped fin.

According to an embodiment, another method is disclosed. The method may include forming a mandrel on an upper surface of a semiconductor on insulator (SOI) layer. The SOI layer may include a dielectric layer on a first semiconductor layer and a second semiconductor layer on the dielectric layer. The method may include removing a portion of the mandrel down to the upper surface of the second semiconductor layer. Removing the portion of the mandrel may produce a first remaining portion of the mandrel and a second remaining portion of the mandrel. The method may include forming a looped spacer on the upper surface of the second semiconductor layer around an inner region of the first remaining portion of the mandrel. The inner region may include a first sidewall extending vertically from the SOI layer, an inner edge extending vertically from the SOI layer, and a second sidewall extending vertically from the SOI layer. The looped spacer may be adjacent to the first sidewall, the inner edge, and the second sidewall. The method may include removing the first remaining portion of the mandrel and the second remaining portion of the mandrel. The method may include removing an exposed portion of the semiconductor layer. Removing the exposed portion of the semiconductor layer may form the looped fin below the looped spacer. The method may include removing the looped spacer. The method may include forming a gate on a looped portion of the looped fin.

According to an embodiment, a structure is disclosed. The structure may include a looped fin extending vertically from an upper surface of a substrate. The looped fin may include a semiconductor material having a compressive stress. A looped portion of the looped fin may include a first portion extending across the substrate in a first direction, a second portion extending across the substrate in a second direction orthogonal to the first direction, and a third portion extending across the substrate in a third direction parallel to the first direction. The structure may include a gate on the looped portion of the looped fin.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIGS. 3A-3B are a top view and a cross section view taken along a section line A-A' of forming a looped spacer adjacent to the mandrel, respectively, according an embodiment of the present invention.

FIGS. 6A-6B are a top view and a cross section view taken along a section line A-A' of removing the looped spacer, respectively, according to an embodiment of the present invention.

FIGS. 7A-7B are a top view and a cross section view taken along a section line A-A' of removing a fin in an inactive area, respectively, according an embodiment of the present invention.

FIGS. 8A-8B are a top view and a cross section view taken along a section line A-A' of forming a gate around a fin, respectively, according an embodiment of the present invention.

FIGS. 9A-9B are a top view and a cross section view taken along a section line A-A' of forming an insulating layer, respectively, according an embodiment of the present invention.

FIGS. 10A-10B are a top view and a cross section view taken along a section line A-A' of forming a hardmask on the insulating layer and the gate, respectively, according an embodiment of the present invention.

FIGS. 11A-11B are a top view and a cross section view taken along a section line A-A' of removing a portion of the gate, respectively, according an embodiment of the present invention.

FIGS. 12A-12B are a top view and a cross section view taken along a section line A-A' of removing a portion of the fins, respectively, according an embodiment of the present invention.

FIGS. 13A-13B are a top view and a cross section view taken along a section line A-A' of forming a confining layer, respectively, according an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
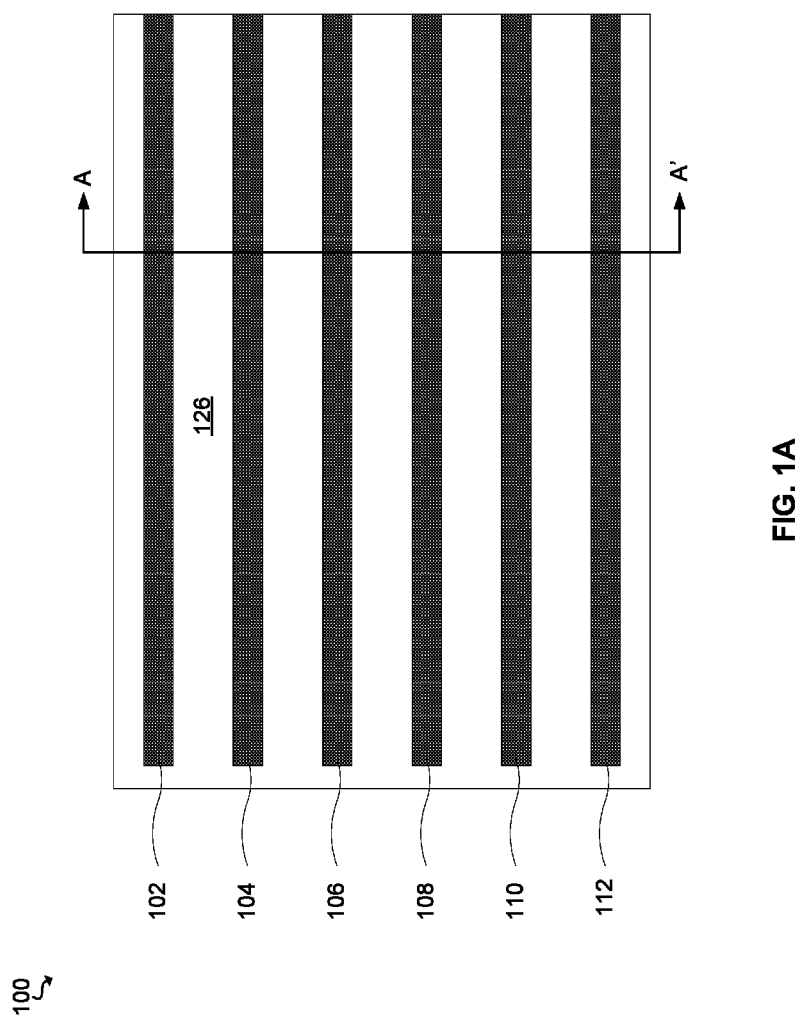
FIGS. 1A-1B are a top view and a cross section view taken along a section line A-A' of a structure, respectively, according an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to microelectronics and more particularly, to a structure and method of retaining stress in fins of fin field-effect transistors (finFETs). Intrinsic stress in a fin of a finFET may boost mobility of charge carriers, and thus, increase performance of the finFET. Cutting an intrinsically stressed semiconductor layer to form fins may reduce the intrinsic stress in a fin compared to the semiconductor layer. A reduction in stress from cutting a fin may result in lost finFET performance.

Embodiments of the present invention provide a structure and method of minimizing stress relaxation during fin formation. Embodiments may involve forming a looped fin adjacent to at least a sidewall of a mandrel. The mandrel may be removed, leaving the looped fin. Forming a looped fin around a mandrel and subsequently removing the mandrel may reduce stress relaxation compared to conventional fin formation methods. Embodiments may include forming a gate over the looped fin. A method of forming fins while minimizing stress relaxation, is described below with reference to FIGS. 1A-13B. A method of forming looped fins is described with reference to FIGS. 1A-8B, and a method of forming a confining layer is described with reference to FIGS. 9A-13B.

Figure 1B:
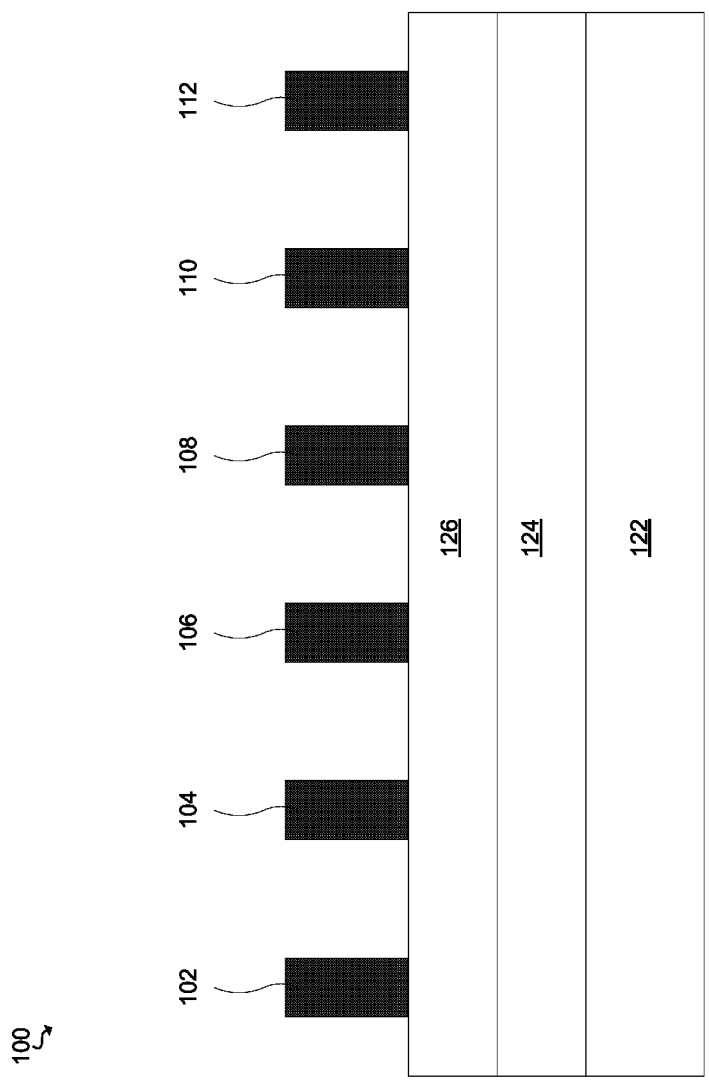

Referring now to FIGS. 1A-1B, a top view and a cross section view taken along a section line A-A' of a structure 100 is shown, according an embodiment of the present invention. The structure 100 may include one or more mandrels (e.g., mandrel 102, mandrel 104, mandrel 106, mandrel 108, mandrel 110, and mandrel 112) on an upper surface of a semiconductor on insulator layer (hereinafter "SOI layer" or "substrate").

The SOI layer may include a first semiconductor layer 122, a dielectric layer 124, and a second semiconductor layer 126. The first semiconductor layer 122 and the second semiconductor layer 126 may be composed of any semiconductor material known in the art, including, for example, silicon, germanium, silicon-germanium alloy, silicon carbide, silicon-germanium carbide alloy, and compound (e.g. III-V and II-VI) semiconductor materials. Nonlimiting examples of compound semiconductor materials include gallium arsenide, indium arsenide, and indium phosphide. In a preferred embodiment, the first semiconductor layer 122 may include silicon. The dielectric layer 124 may be composed of any dielectric material known in the art, including, for example, silicon oxide, silicon nitride, silicon oxynitride, SiBCN, SiOCN, or a combination of dielectric materials.

Still referring to FIG. 1, one or more mandrel (e.g., mandrel 102, mandrel 104, mandrel 106, mandrel 108, mandrel 110, and mandrel 112) may be formed on an upper surface of the second semiconductor layer 126. Although six mandrels are shown in FIG. 1, it is understood that any number of mandrels may be used within the scope of the invention. The one or more mandrels may be composed of any dielectric material known in the art, including, for example, silicon oxide, silicon nitride, silicon oxynitride, SiBCN, SiOCN, or a combination of dielectric materials. The one or more mandrels may have a first sidewall and a second sidewall that are arranged at an angle (e.g., a non-zero angle) relative to the upper surface of the SOI layer. The first and second sidewalls may be arranged at different angles relative to the upper surface of the SOI layer. For example, each mandrel may have a substantially trapezoidal shape in cross section.

The one or more mandrels may be formed using conventional processing techniques, such as deposition, masking, and etching. For example, any number of mandrels may be simultaneously formed by first forming a layer of mandrel material, e.g., a layer of silicon dioxide formed using chemical vapor deposition (CVD) on the second semiconductor layer 126. Then a photomask may be provided by forming a layer of photoresist material on the layer of mandrel material, exposing the photoresist material to a pattern of light, and developing the exposed photoresist material. An etching process, such as a reactive ion etch (RIE), may then be used to form patterns (e.g., openings) in the layer of mandrel material by removing portions of the layer of mandrel material that are not covered by the photomask. After etching, the photomask may be removed using a conventional ashing or stripping process. The unetched portions of the layer of mandrel material that remain after the masking and etching form the one or more mandrels. The one or more mandrels may be formed with angled sidewalls (e.g., a substantially trapezoidal shape) by using a tapered resist profile (e.g., with a half-tone mask, or by intentionally eroding portions of the resist prior to or during the etching step).

Figure 2A:
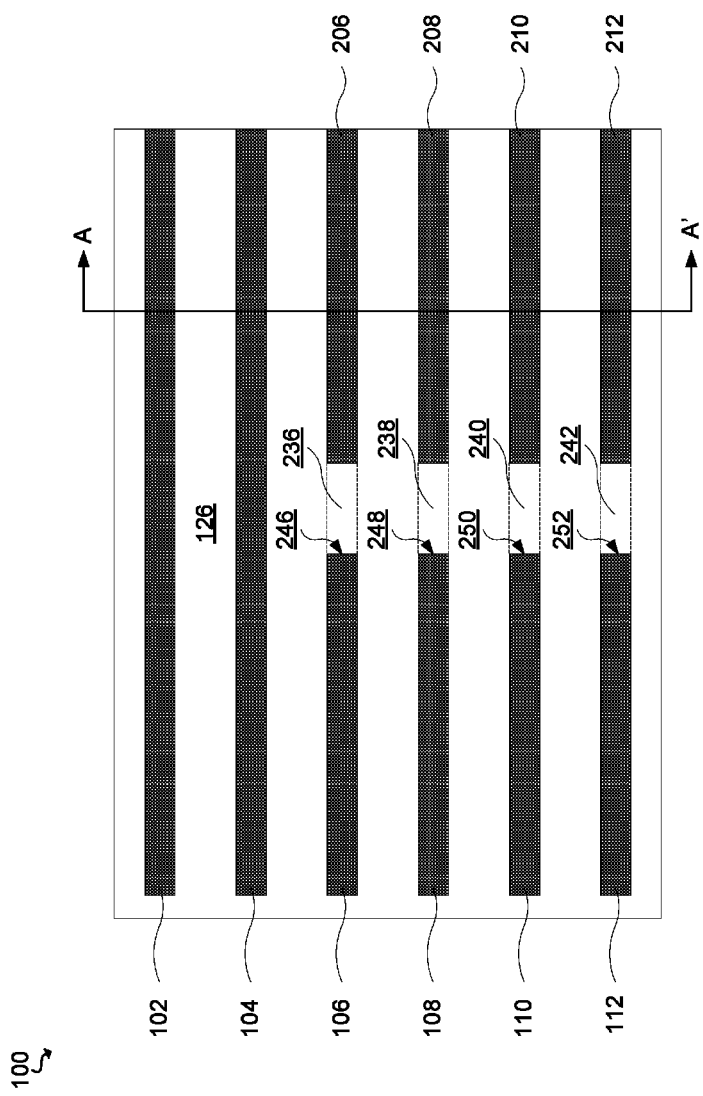
FIGS. 2A-2B are a top view and a cross section view taken along a section line A-A' of removing a portion of a mandrel, respectively, according an embodiment of the present invention.
Figure 2B:
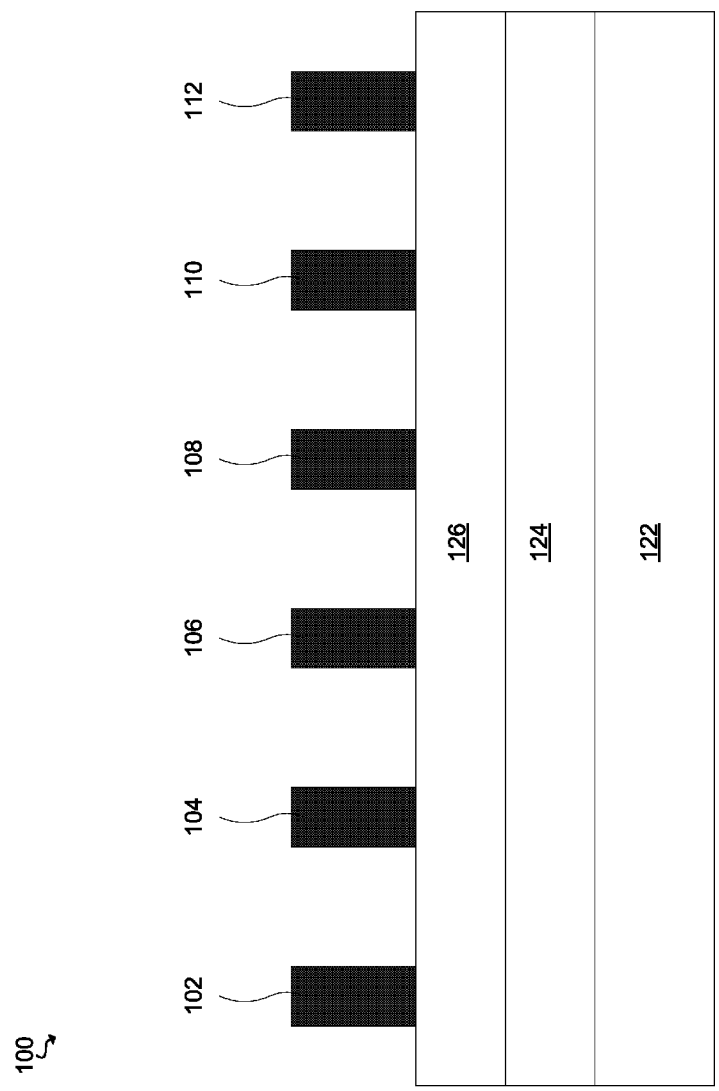

Referring now to FIGS. 2A-2B, a top view and a cross section view taken along a section line A-A' of removing a portion of at least one mandrel is shown, according an embodiment of the present invention. In an embodiment, one or more portions may be removed from one or more mandrels. For example, the portion 236 may be removed from the mandrel 106, the portion 238 may be removed from the mandrel 108, the portion 240 may be removed from the mandrel 110, and the portion 242 may be removed from the mandrel 112. The one or more portions may be removed from the one or more mandrels using any material removal method known in the art, such as, for example, masking and etching, photolithography, or a combination thereof.

In an embodiment, removing the one or more portions may form an inner edge a mandrel. For example, removing the portion 236 may form an inner edge 246 of the mandrel 106, removing the portion 238 may form an inner edge 248 of the mandrel 108, removing the portion 240 may form an inner edge 250 of the mandrel 110, and removing the portion 242 may form an inner edge 252 of the mandrel 112.

In an embodiment, removing the one or more portions from the one or more mandrels may leave an inactive mandrel in an inactive area of a wafer. For example, one or more inactive mandrels may be left in an inactive area near an outer edge of a wafer. In an example, removing the one or more portions from the one or more mandrels may leave inactive mandrel 206, inactive mandrel 208, inactive mandrel 210, and inactive mandrel 212. It should be appreciated that embodiments of forming active mandrels on each side of a removed portion are contemplated.

Figure 3A:
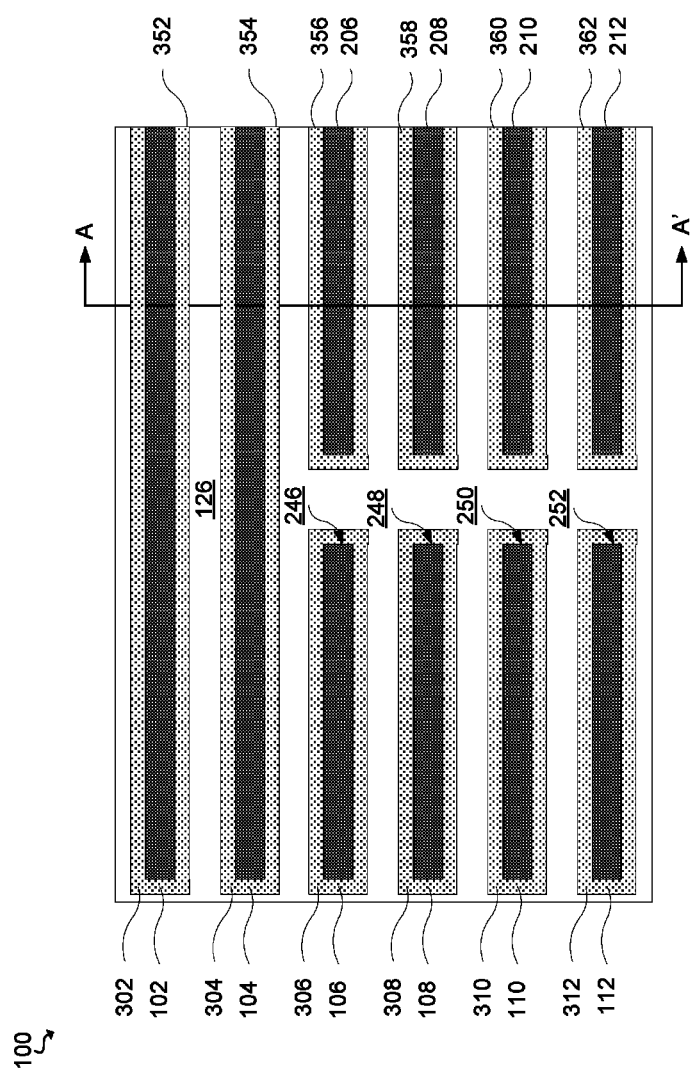

Referring now to FIGS. 3A-3B, a top view and a cross section view taken along a section line A-A' of forming one or more looped spacers adjacent to one or more mandrels is shown, according an embodiment of the present invention. Each looped spacers may be formed on an upper surface of the SOI layer (e.g. on an upper surface of the second semiconductor layer 126) and adjacent to a sidewall of a mandrel. The one or more looped spacers may be formed by any conventional formation method, such as, for example, by deposition adjacent to the mandrels or chemical reaction of the mandrels. Nonlimiting examples of deposition techniques for forming the one or more looped spacers include sidewall image transfer (SIT), rapid thermal chemical vapor deposition (RTCVD), low-energy plasma deposition (LEPD), ultra-high vacuum chemical vapor deposition (UHVCVD), atmospheric pressure chemical vapor deposition (APCVD), and molecular beam epitaxy (MBE). In an embodiment, etching may be used to remove excess material on horizontal surfaces, leaving only the looped spacers on the sidewalls of the mandrels.

In an embodiment, non-looped spacers (e.g. spacer 302, spacer 352, spacer 304, and spacer 354) may be formed adjacent to the mandrel 102 and the mandrel 104 and looped spacers (e.g. spacer 306, spacer 308, spacer 310, and spacer 312) may be formed around the mandrel 106, the mandrel 108, the mandrel 110, and the mandrel 112. The spacer 302 and the spacer 352 may be formed on an upper surface of the second semiconductor layer 126 and adjacent to the mandrel 102. The spacer 304 and the spacer 354 may be formed on an upper surface of the second semiconductor layer 126 and adjacent to the mandrel 104. The spacer 306 may be formed on an upper surface of the second semiconductor layer 126 and adjacent to more than one sidewall of the mandrel 106. The spacer 308 may be formed on an upper surface of the second semiconductor layer 126 and adjacent to more than one sidewall of the mandrel 108. The spacer 310 may be formed on an upper surface of the second semiconductor layer 126 and adjacent to more than one sidewall of the mandrel 110. The spacer 312 may be formed on an upper surface of the second semiconductor layer 126 and adjacent to more than one sidewall of the mandrel 112.

In an embodiment, the spacer 306, the spacer 308, the spacer 310, and the spacer 312 may be adjacent to a sidewall on more than one side of a mandrel and around an inner edge of the mandrel. For example, the spacer 306 may be adjacent to and in contact with a first sidewall of the mandrel 106, the inner edge 246, and a second sidewall of the mandrel 106. The spacer 308 may be adjacent to and in contact with a first sidewall of the mandrel 108, the inner edge 248, and a second sidewall of the mandrel 108. The spacer 310 may be adjacent to and in contact with a first sidewall of the mandrel 110, the inner edge 250, and a second sidewall of the mandrel 110. The spacer 312 may be adjacent to and in contact with a first sidewall of the mandrel 112, the inner edge 252, and a second sidewall of the mandrel 112. Embodiments of a spacer formed around a first sidewall, a first inner edge, a second sidewall, and a second inner edge are contemplated. A spacer formed around a first sidewall, at least an inner edge, and a second sidewall may be referred to as, for example, a "u-shaped spacer", a "loop spacer", or a "looped spacer".

In embodiment, inactive spacer may be formed around two sides and an inner edge of the inactive mandrel 206, the inactive mandrel 208, the inactive mandrel 210, and the inactive mandrel 212. The spacer 356 may be adjacent to and in contact with a first sidewall of the inactive mandrel 206, an inner edge of the inactive mandrel 206, and a second sidewall of the inactive mandrel 206. The spacer 358 may be adjacent to and in contact with a first sidewall of the inactive mandrel 208, an inner edge of the inactive mandrel 208, and a second sidewall of the inactive mandrel 208. The spacer 360 may be adjacent to and in contact with a first sidewall of the inactive mandrel 210, an inner edge of the inactive mandrel 210, and a second sidewall of the inactive mandrel 210. The spacer 360 may be adjacent to and in contact with a first sidewall of the inactive mandrel 210, an inner edge of the inactive mandrel 210, and a second sidewall of the inactive mandrel 210. The spacer 362 may be adjacent to and in contact with a first sidewall of the inactive mandrel 212, an inner edge of the inactive mandrel 212, and a second sidewall of the inactive mandrel 212. It should be appreciated that embodiments of forming active fins adjacent to each side of a removed portion (e.g. portion 236 of FIG. 2A) are contemplated. For example, embodiments involving removing a portion 236 to form two active mandrels and forming active spacers (to form active fins in FIG. 5A-5B) on each active mandrel are contemplated.

Figure 4A:
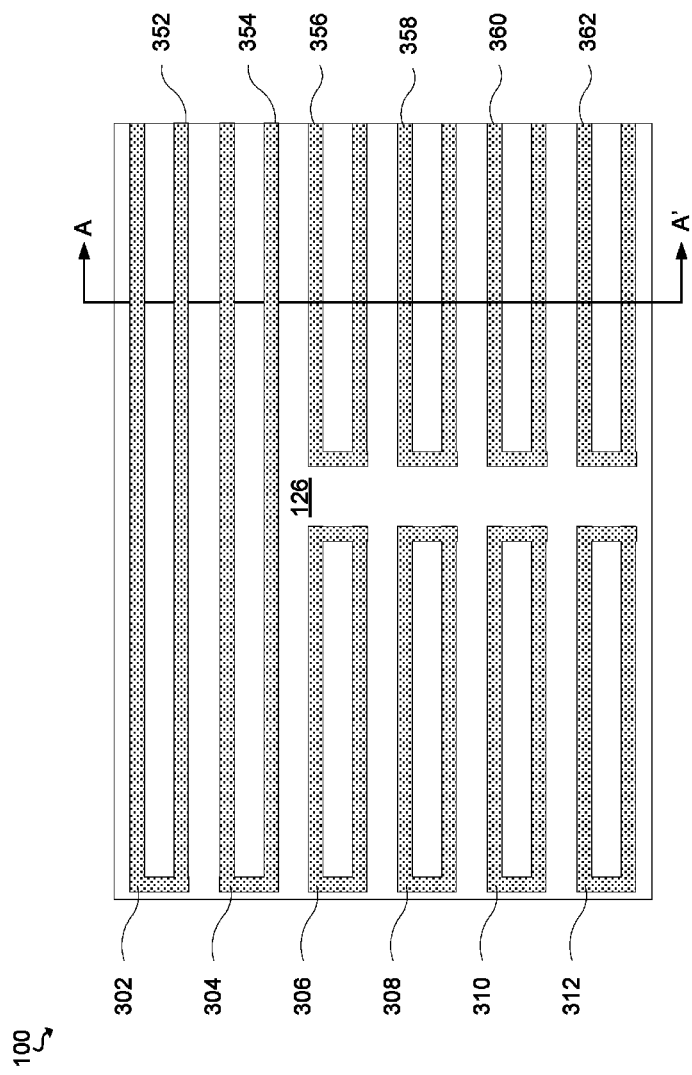
FIGS. 4A-4B are a top view and a cross section view taken along a section line A-A' of removing the mandrel, respectively, according an embodiment of the present invention.
Figure 4B:

Referring now to FIGS. 4A-4B, a top view and a cross section view taken along a section line A-A' of removing one or more mandrels is shown, according an embodiment of the present invention. The one or more mandrels may be removed using a conventional removal process, such as, for example, an etch selective to the mandrel material. For example, if the one or more mandrels are composed of silicon dioxide, an etchant may be selective to silicon dioxide. In a preferred embodiment, the etchant may display high selectivity of a material of the mandrel over a material of an upper layer of the SOI layer. For example, if the mandrels are composed of silicon nitride and an upper layer of the SOI layer is composed of silicon dioxide, an etchant that is highly selective of silicon nitride over silicon dioxide (e.g., a plasma chemical dry etch) may be used.

In an embodiment, the mandrel 102, the mandrel 104, the mandrel 106, the mandrel 108, the mandrel 110, the mandrel 112, the inactive mandrel 206, the inactive mandrel 208, the inactive mandrel 210, and the inactive mandrel 212 may be removed. The one or more spacers may remain on an upper surface of the SOI layer. The spacer 306, the spacer 308, the spacer 310, the spacer 312, the spacer 356, the spacer 358, the spacer 360, and the spacer 362 may have a u-shaped or a looped structure.

Figure 5A:
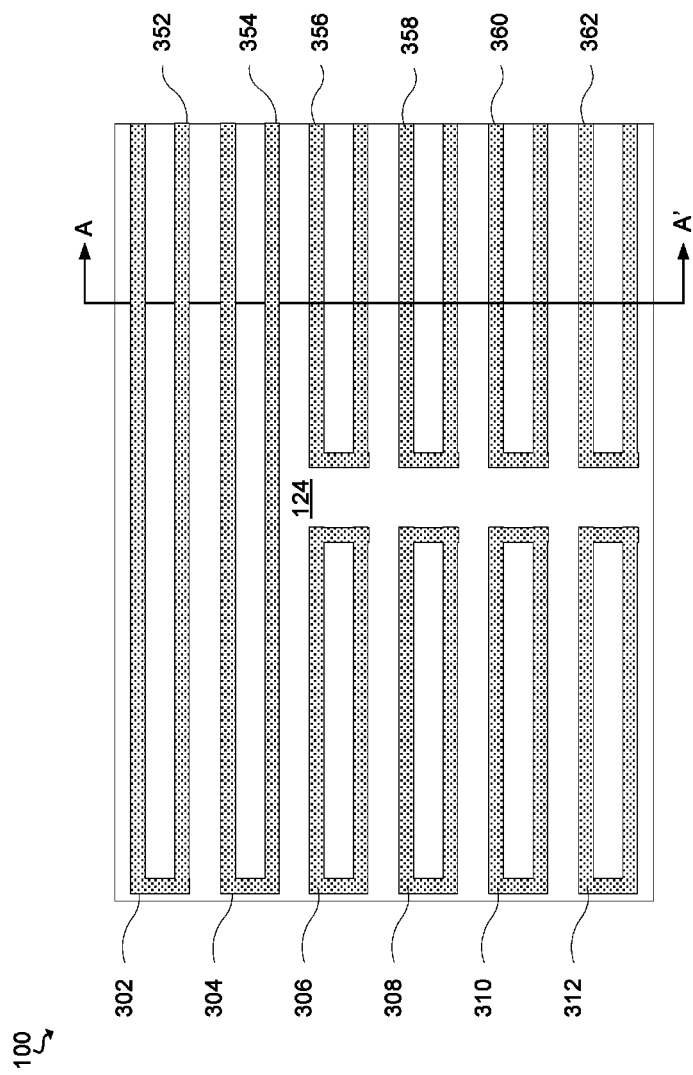
FIGS. 5A-5B are a top view and a cross section view taken along a section line A-A' of removing a portion of an SOI layer to form a looped fin, respectively, according to an embodiment of the present invention.
Figure 5B:
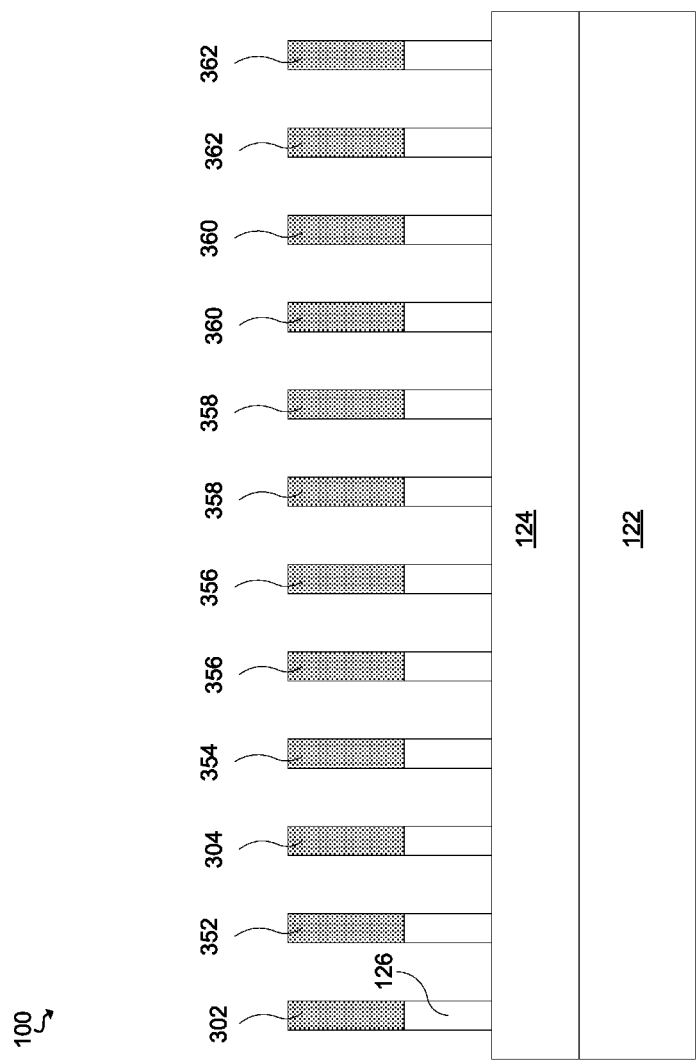

Referring now to FIGS. 5A-5B, a top view and a cross section view taken along a section line A-A' of removing a portion of the SOI layer to form a looped fin is shown, according to an embodiment of the present invention. An exposed portion of the second semiconductor layer 126 (FIG. 4A-4B) may be removed using any material removal process known in the art, such as, for example, photolithography and/or RIE. The exposed portion of the second semiconductor layer 126 may be any portion of the second semiconductor layer 126 that is not covered by one or more spacers (e.g. spacer 302, spacer 304, spacer 306, spacer 308, spacer 310, spacer 312, spacer 352, spacer 354, spacer 356, spacer 358, spacer 360, and spacer 362). By removing the exposed portion of the second semiconductor layer 126, one or more fins may be formed. A spacer may be used as a hardmask to pattern fins into a particular shape. A fin may be patterned into a same shape as a spacer above the fin (e.g., fins formed under looped spacers may be looped fins). In an example, a looped fin may be formed under the spacer 306, the spacer 308, the spacer 310, the spacer 312, the spacer 356, the spacer 358, the spacer 360, and the spacer 362. Non-looped fins may be formed under non-looped spacers, such as, for example, the spacer 302, the spacer 304, the spacer 352, and the spacer 354. In an embodiment, a looped fin may have at least one looped portion. For example, a looped fin under the spacer 306 may have a looped portion on one end closest to the spacer 356 and a non-looped portion (not shown) on another end furthest from the spacer 356. The non-looped portion may have a free surface which may be secured by a confining layer, discussed below with reference to FIGS. 9A-13B. In an example, a looped fin may have more than one looped portion. For example, a looped fin under the spacer 306 may have a looped portion at an end closest to the spacer 356 and another looped end (not shown) furthest from the spacer 356. It must be appreciated that "looped portion" as used within the present disclosure, refers to the area connecting the non-looped portions. In an embodiment, spacer 310 contains the non-looped portions of 311A and 311B and the looped portion of 311C. In this embodiment, "looped portion" refers to the u-shape vertical piece connecting the two non-looped portions. In other embodiments, the looped portion may be curved or connecting two horizontal pieces.

Figure 6A:
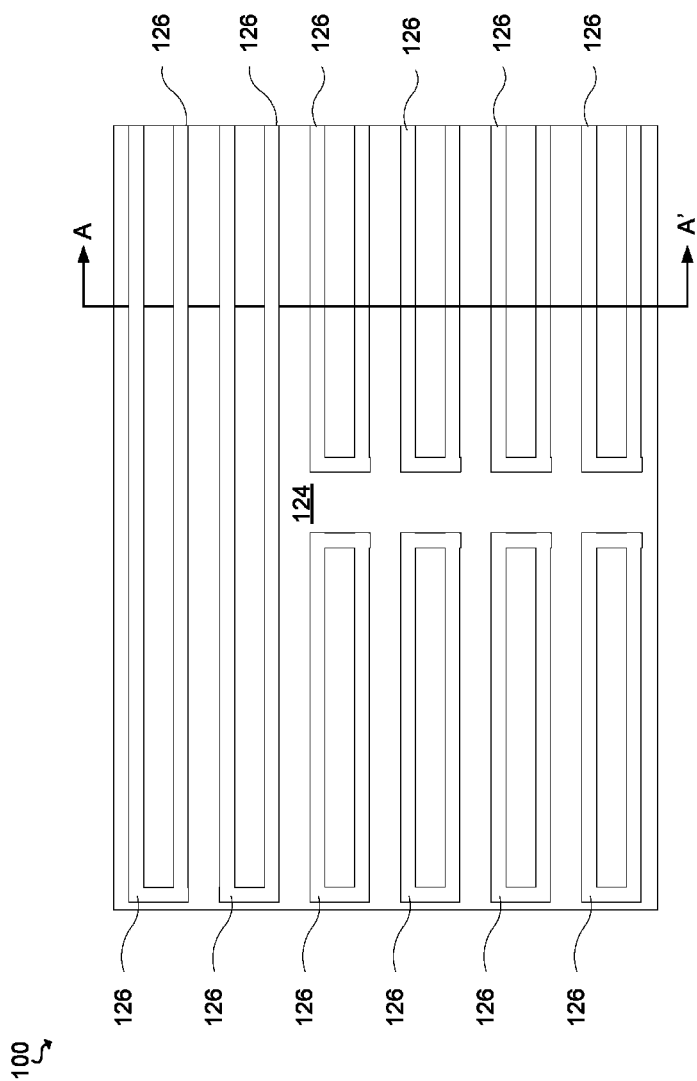

Referring now to FIGS. 6A-6B, a top view and a cross section view taken along a section line A-A' of removing the looped spacer is shown, according to an embodiment of the present invention. The one or more spacers may be removed using a conventional material removal process, such as, for example, an etch selective to a material of the one or more spacers. Removing the one or more spacers may expose the one or more fins below the one or more spacers. For example, by removing the spacer 306 (FIG. 5A), a looped fin below the spacer 306 may be exposed.

Figure 7A:
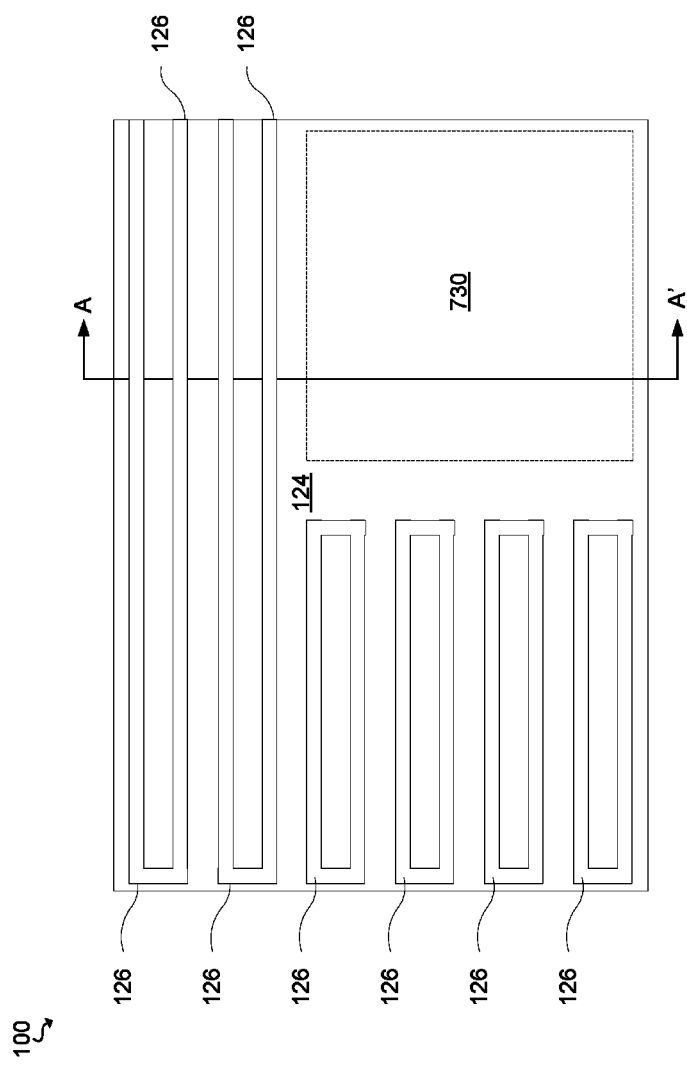

Referring now to FIGS. 7A-7B, a top view and a cross section view taken along a section line A-A' of removing one or more fins in an inactive area 730 is shown, according an embodiment of the present invention. In an embodiment, inactive area 730 may be inactive due to a proximity to an outer edge of a wafer. One or more fins in the inactive area 730 may be removed. The one or more fins may be removed using any material removal process known in the art, such as, for example, masking and etching, photolithography, or a combination thereof.

In an embodiment, the inactive area 730 may be an active area and the one or more fins may be retained. For example, the one or more fins in the active area may be used to form one or more transistors. In another embodiment, the inactive area 730 may be an inactive area and the one or more fins may be retained. For example, the one or more fins in the inactive area 730 may be retained and dummy transistors may be formed using the one or more fins in the inactive area 730.

Figure 8A:
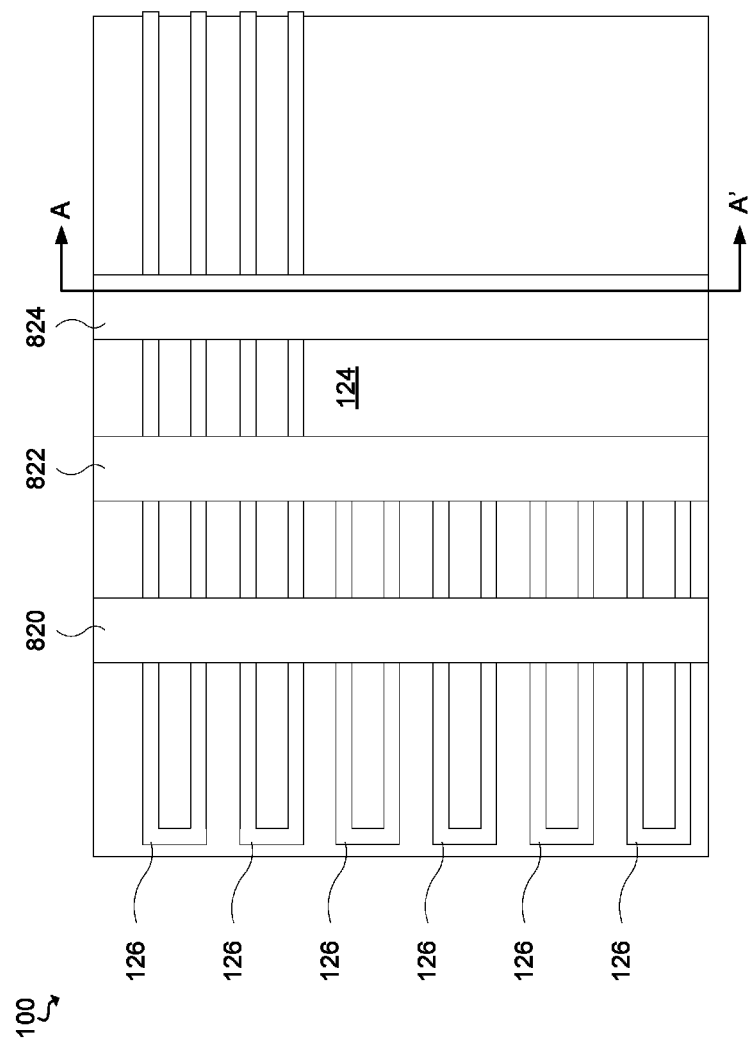

Referring now to FIGS. 8A-8B, a top view and a cross section view taken along a section line A-A' of forming one or more gates on an upper surface of the dielectric layer 124 and around one or more fins is shown, according an embodiment of the present invention. The one or more gates may include, for example, the gate 820, the gate 822, and the gate 824. The gate 822 may be formed over a looped portion of one or more looped fins. The looped portion of one or more fins under a gate may be referred to as a "looped portion", "curved portion", "tucked portion" or any combination thereof. A gate over the looped portion of a fin may secure the looped portion in position. Securing the looped portion in position may decrease stress relaxation in the fin.

A gate may be formed on an upper surface of the SOI layer and over a portion of the fins. The gate may have a height ranging from approximately 40 nm to approximately 200 nm, preferably ranging from approximately 50 nm to approximately 150 nm. The gate may include a gate dielectric layer (not shown) on the fins and a gate electrode (not shown) on the gate dielectric layer that may be formed via any known process in the art, including a gate-first process and a gate-last process.

In a gate-first process, the gate dielectric layer may include any suitable insulating material including, but not limited to: oxides, nitrides, oxynitrides or silicates including metal silicates and nitrided metal silicates. In one embodiment, the gate dielectric may include a high-k oxide such as, for example, silicon oxide ($Si_xO_y$), hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The gate dielectric layer may be deposited over the fins using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). The gate electrode may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode may be formed using any suitable metal deposition technique, including, for example, CVD, PVD, and ALD, sputtering, and plating.

In a gate-last process, the gate may include a sacrificial gate that may be later removed and replaced by a gate dielectric layer and a gate electrode such as those of the gate-first process described above. In an exemplary embodiment, the sacrificial gate may be made of a polysilicon material with a sacrificial dielectric material (e.g., silicon oxide) formed using any deposition technique known in the art, including, for example, ALD, CVD, PVD, MBD, PLD, LSMCD, sputtering, and plating. Other suitable materials and methods of forming a sacrificial gate are known in the art.

Referring now to FIGS. 1A-8B, embodiments of forming the structure 100 are shown. A method of forming fin field-effect transistor with a looped fin (e.g. the structure 100) may include forming a looped spacer (e.g., spacer 306) around a first portion of a mandrel (e.g. mandrel 106) on an upper surface of a substrate (e.g., the SOI layer). The looped spacer may be adjacent to a first sidewall of the first portion of the mandrel, an inner edge (e.g., inner edge 246) of the first portion of the mandrel, and a second sidewall of the first portion of the mandrel. The method may include removing the first portion of the mandrel (e.g., as in FIGS. 4A-4B). The method may include removing an exposed portion of the substrate (e.g., as in FIGS. 5A-5B). Removing the exposed portion of the substrate may forms a looped fin below the looped spacer (e.g., as in FIGS. 5A-5B). The method may include removing the looped spacer (e.g., as in FIGS. 6A-6B). The method may include forming a gate on the upper surface of the substrate and on a looped portion of the looped fin (e.g., as in FIGS. 8A-8B).

The structure 100 may include u-shaped and/or loop shaped fins. Embodiments include forming a looped fin around a mandrel with a portion removed. Embodiments include forming a looped fin around a mandrel with two portions removed. Embodiments include removing a remaining portion of a mandrel and leaving the u-shaped and/or looped fin on an upper surface of the SOI layer. Fins having a u-shape and/or a loop shape may have less stress relaxation than conventional fins. Conventional fins may have a free surface on each end which may result in greater relaxation. Looped fins may not have a free surface from which relaxation may propagate. Embodiments may include forming a gate over a looped portion (i.e. curved portion) of a u-shaped and/or a looped fin. A gate over a looped portion of a fin may secure the looped portion in a position. Securing a looped portion in a position may decrease stress relaxation in the fin. Thus, looped fins with a curved portion of the looped fins under a gate may have substantially reduced stress relaxation compared to conventional fins.

A method of forming a confining layer is described below, with reference to FIGS. 9A-13B.

Referring now to FIGS. 9A-9B, a top view and a cross section view taken along a section line A-A' of forming an insulating layer 902 is shown, according an embodiment of the present invention. The insulating layer may be formed between one or more gates (e.g. between the gate 820 and the gate 822, between the gate 822 and the gate 824, etc.). The insulating layer 902 may insulate one or more components from other components, such as, for example, insulate the gate 820 from a capacitance from the gate 822. The insulating layer 902 may be formed using a conventional masking and etching process. The insulating layer 902 may be composed of any dielectric material known in the art, including, for example, silicon oxide, silicon nitride, silicon oxynitride, SiBCN, SiOCN, or a combination of dielectric materials.

Referring now to FIGS. 10A-10B, a top view and a cross section view taken along a section line A-A' of forming a hardmask 1002 on the insulating layer 902 and one or more gates (e.g., the gate 820, the gate 822, and the gate 824) is shown, according an embodiment of the present invention. The hardmask may be formed using a conventional deposition process. The hardmask 1002 may be composed of any dielectric material known in the art, including, for example, silicon oxide and silicon nitride. The hardmask 1002 may have one or more openings leaving one or more areas exposed underneath. For example, the hardmask 1002 may have an opening leaving a portion of the gate 824 exposed.

Figure 11B:
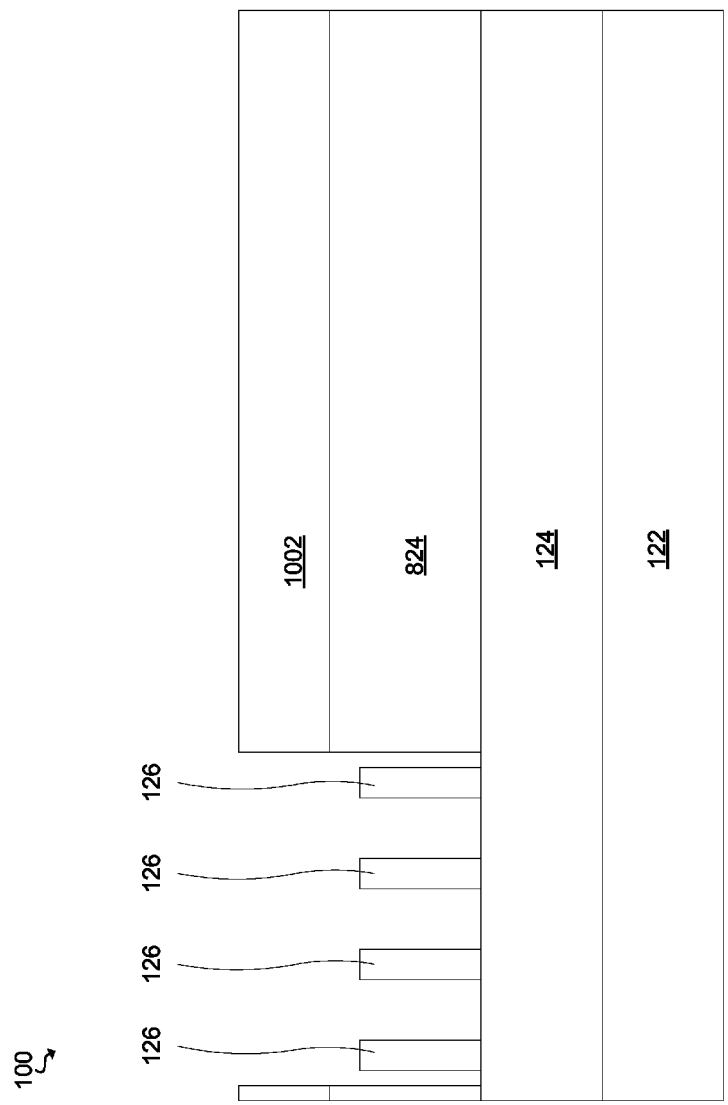

Referring now to FIGS. 11A-11B, a top view and a cross section view taken along a section line A-A' of removing the exposed portion of the gate 824 (FIGS. 10A-10B) is shown, according an embodiment of the present invention. The exposed portion of the gate 824 may be removed using any conventional material removal process, such as, for example, an etching process selective to a material of the gate 824 or RIE. A process of removing the exposed portion of the gate 824 may leave a portion of one or more fins exposed. For example, a portion of one or more fins below the opening in the hardmask 1002 may be exposed (i.e. a visible portion of one or more fins formed from the second semiconductor layer 126 in FIG. 11A).

Figure 12A:
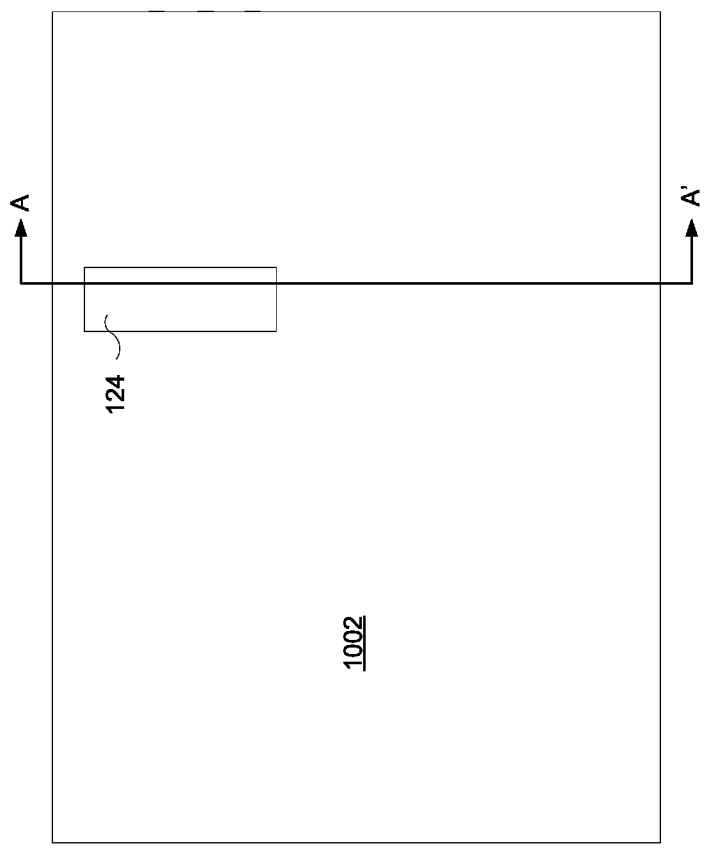

Referring now to FIGS. 12A-12B, a top view and a cross section view taken along a section line A-A' of removing a portion of the fins (e.g., a portion of the one or more fins below the opening in the hardmask 1002) is shown, according an embodiment of the present invention. The portion of the fins below the opening in the hardmask 1002 may be removed using a conventional material removal process, such as, for example, an etch selective to a material of the fins or RIE.

Figure 13A:
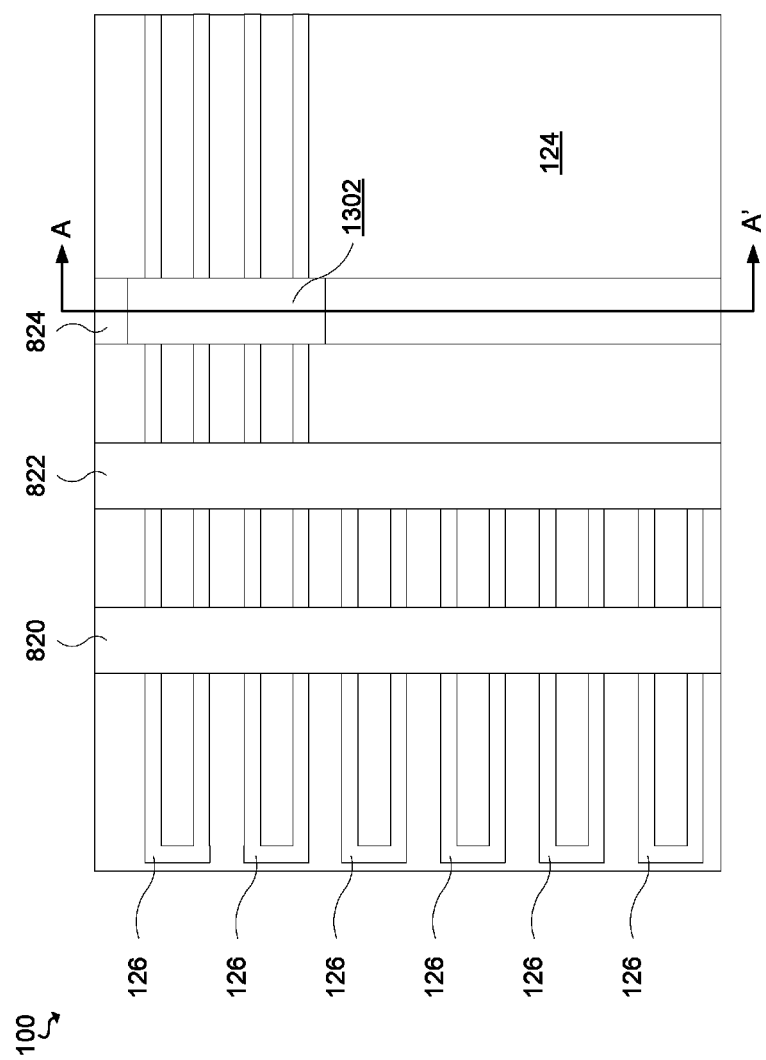

Referring now to FIGS. 13A-13B, a top view and a cross section view taken along a section line A-A' of removing the hardmask 1002 (FIGS. 10A-10B) and forming a confining layer 1302 is shown, according an embodiment of the present invention. The hardmask 1002 may be removed using a conventional removal process, such, as for example, a etch selecting to a material of the hardmask 1002. The confining layer 1302 may be formed using any deposition technique known in the art, including, for example, ALD, CVD, PVD, MBD, PLD, LSMCD, sputtering, and plating. The confining layer 1302 may be composed of any dielectric material known in the art, including, for example, silicon oxide, silicon nitride, silicon oxynitride, SiBCN, SiOCN, or a combination of dielectric materials. The confining layer 1302 may restrict movement of one or more fins by acting as a physical barrier. By restricting movement of one or more fins, the confining layer 1302 may reduce stress relaxation in the one or more fins.

Various embodiments of forming looped fin(s) and/or confining layer(s) to reduce stress relaxation are contemplated. In an embodiment, a looped fin and a confining layer may be formed on separate fins. In an embodiment, a looped fin may include a confining layer on one end. For example, a fin may be in a "u-shaped" so that it has a looped end and an opposite end with a confining layer restricting movement of a non-looped end. In an embodiment, a fin may have two looped ends with a confining layer adjacent to each looped end. In an embodiment, a fin may not have a looped end and a confining layer adjacent to each non-looped end.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming fin field-effect transistor with a looped fin comprising:
    forming a looped spacer around a first portion of a mandrel on an upper surface of a substrate;
    wherein the looped spacer is adjacent to a first sidewall of the first portion of the mandrel, an inner edge of the first portion of the mandrel, and a second sidewall of the first portion of the mandrel;
    removing the first portion of the mandrel;
    removing an exposed portion of the substrate, wherein the removing the exposed portion of the substrate forms the looped fin below the looped spacer;
    removing the looped spacer; and
    forming a gate extending in a first direction on the upper surface of the substrate and on a curved portion of the looped fin, wherein at least a portion of the curved portion of the looped fin is under the gate and extends in the first direction.

2. The method of claim 1, further comprising:
    forming a confining layer on the upper surface of the substrate parallel to at least a portion of the curved portion of the looped fin.

3. The method of claim 1, further comprising:
    forming another gate on the upper surface of the substrate and the looped fin.

4. The method of claim 1, wherein the looped fin comprises the curved portion on one end and another curved portion on another end.

5. The method of claim 1, wherein the looped fin comprises a non-curved portion comprising one or more free surfaces.

6. The method of claim 1, further comprising:
    forming a confining layer on the upper surface of the substrate perpendicular to and contacting a non-curved portion of the looped fin, wherein the non-curved portion comprises one or more free surfaces.

7. The method of claim 1, wherein the looped fin comprises a semiconductor material having a compressive stress.

8. The method of claim 1, wherein the method is performed on one or more portions of the substrate to form one or more curved portions of the looped fin.

9. A method of forming a fin field-effect transistor with a looped fin comprising:
    forming a mandrel on an upper surface of a semiconductor on insulator (SOI) layer, wherein the SOI layer comprises a dielectric layer on a first semiconductor layer and a second semiconductor layer on the dielectric layer;
    removing a portion of the mandrel down to the upper surface of the second semiconductor layer,
    wherein removing the portion of the mandrel produces a first remaining portion of the mandrel and a second remaining portion of the mandrel,
    forming a looped spacer on the upper surface of the second semiconductor layer around an inner region of the first remaining portion of the mandrel,
    wherein the inner region comprises a first sidewall extending vertically from the SOI layer, an inner edge extending vertically from the SOI layer, and a second sidewall extending vertically from the substrate, and
    wherein the looped spacer is adjacent to the first sidewall, the inner edge, and the second sidewall;
    removing the first remaining portion of the mandrel and the second remaining portion of the mandrel;
    removing an exposed portion of the semiconductor layer, wherein the removing the exposed portion of the semiconductor layer forms the looped fin below the looped spacer;
    removing the looped spacer; and
    forming a gate extending in a first direction on a curved portion of the looped fin, wherein at least a portion of the curved portion of the looped fin is under the gate and extends in the first direction.

10. The method of claim 9, further comprising:
    forming a confining layer on the upper surface of the dielectric layer parallel to at least a portion of the curved portion of the looped fin.

11. The method of claim 9, further comprising:
    forming another gate on the upper surface of the dielectric and the looped fin.

12. The method of claim 9, wherein the looped fin comprises a non-curved portion comprising one or more free surfaces.

13. The method of claim 9, further comprising:
    forming a confining layer on the upper surface of the SOI layer perpendicular to and contacting a non-curved portion of the looped fin, wherein the non-curved portion comprises one or more free surfaces.

14. The method of claim 9, wherein the looped fin comprises a semiconductor material having a compressive stress.

15. The method of claim 9, wherein the method is performed on one or more portions of the SOI layer to form one or more curved portions of the looped fin.

* * * * *